US009208899B2

(12) United States Patent
Deng et al.

(10) Patent No.: US 9,208,899 B2
(45) Date of Patent: Dec. 8, 2015

(54) UNIVERSAL TEST STRUCTURES BASED SRAM ON-CHIP PARAMETRIC TEST MODULE AND METHODS OF OPERATING AND TESTING

(75) Inventors: Xiaowei Deng, Plano, TX (US); Wah K. Loh, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 57 days.

(21) Appl. No.: 12/774,044

(22) Filed: May 5, 2010

(65) Prior Publication Data

US 2011/0273946 A1 Nov. 10, 2011

(51) Int. Cl.
*G11C 29/48* (2006.01)
*G11C 29/54* (2006.01)
*G11C 29/50* (2006.01)
*G11C 29/12* (2006.01)
*G11C 11/416* (2006.01)

(52) U.S. Cl.
CPC .............. *G11C 29/48* (2013.01); *G11C 29/54* (2013.01); *G11C 11/416* (2013.01); *G11C 29/12* (2013.01); *G11C 29/50* (2013.01); *G11C 29/50004* (2013.01); *G11C 29/50016* (2013.01); *G11C 2029/5002* (2013.01); *G11C 2029/5004* (2013.01); *G11C 2029/5006* (2013.01)

(58) Field of Classification Search
CPC ........ G11C 29/12; G11C 29/48; G11C 29/50; G11C 29/50004; G11C 29/50016; G11C 29/5002; G11C 29/5004; G11C 29/5006; G11C 29/54
USPC .................................................. 365/154, 201
See application file for complete search history.

(56) References Cited

U.S. PATENT DOCUMENTS

| | | | |
|---|---|---|---|
| 5,200,907 A * | 4/1993 | Tran .............................. | 326/113 |
| 6,288,593 B1 * | 9/2001 | Tran et al. ..................... | 327/408 |
| 2002/0163838 A1 * | 11/2002 | Guterman et al. ....... | 365/185.28 |
| 2003/0023788 A1 * | 1/2003 | Mori et al. ...................... | 710/52 |
| 2008/0144421 A1 | 6/2008 | Deng et al. | |
| 2008/0148116 A1 | 6/2008 | Deng et al. | |

* cited by examiner

*Primary Examiner* — Hoai V Ho
*Assistant Examiner* — Jay Radke
(74) *Attorney, Agent, or Firm* — Rose Alyssa Keagy; Frank D. Cimino (57) ABSTRACT

An integrated circuit on-chip parametric (OCP) test structure includes a static random access memory (SRAM) universal test structure (UTS) having UTS ports and an OCP controller configured to determine first and second UTS ports of the SRAM UTS for independent connection to first and second on-chip test pads, respectively. The integrated circuit OCP test structure further includes a UTS OCP router connected to the OCP controller and configured to connect the first and second UTS ports of the SRAM UTS to the first and second on-chip test pads, respectively. Methods of operating an integrated circuit OCP test structure and OCP testing of an integrated circuit are also included.

8 Claims, 13 Drawing Sheets

UNIVERSAL TEST STRUCTURES BASED SRAM ON-CHIP PARAMETRIC TEST MODULE AND METHODS OF OPERATING AND TESTING

TECHNICAL FIELD

This application is directed, in general, to integrated circuits and, more specifically, to an on-chip parametric (OCP) test structure, a method of operating an integrated circuit OCP test structure and a method of OCP testing of an integrated circuit having a static random access memory (SRAM) containing a plurality of SRAM universal test structures (UTSs) with UTS ports.

BACKGROUND

Memory cells as bits are frequently used in integrated circuits and, they often require a major portion of an integrated circuit. Consequently, memory cells are usually designed with minimum area while meeting the required performance and yield targets for the memory. To achieve minimum area, near-minimum device sizes and smaller-than-logic design rules are usually used in memory cells. As a result, memory bit failures due to transistor variation and subtle process defects often determine the yield of the memory and therefore, the yield of the integrated circuit. To better understand the root cause of memory bit fail for memory cell design and allow further process improvement, expensive and often time-consuming and destructive physical failure analysis (PFA) is used after a functional bit failure signature occurs. With continued technology scaling, PFA has become more difficult and improvements in testing capabilities would prove beneficial in the art.

SUMMARY

In one embodiment, an integrated circuit on-chip parametric (OCP) test structure includes a static random access memory (SRAM) universal test structure (UTS) having UTS ports. The integrated circuit OCP test structure also includes an OCP controller configured to determine first and second UTS ports of the SRAM UTS for independent connection to first and second on-chip test pads, respectively. The integrated circuit OCP test structure further includes a UTS OCP router connected to the OCP controller and configured to connect the first and second UTS ports of the SRAM UTS to the first and second on-chip test pads, respectively.

In another embodiment, an integrated circuit includes an SRAM containing a plurality of SRAM UTSs having UTS ports. The integrated circuit also includes an OCP controller that determines a pair of UTS ports of a selected one of the plurality of SRAM UTSs for independent connection to a pair of on-chip test pads. The integrated circuit further includes a UTS OCP router that is connected to the OCP controller and connects the pair of UTS ports of the selected one of the plurality of SRAM UTSs to the pair of on-chip test pads.

In another aspect, a method of operating an integrated circuit OCP test structure includes providing an SRAM UTS having UTS ports, determining first and second UTS ports of the SRAM UTS for independent connection to first and second on-chip test pads and connecting the first and second UTS ports of the SRAM UTS to the first and second on-chip test pads.

In yet another aspect, a method of OCP testing of an integrated circuit includes providing a plurality of SRAM UTSs having UTS ports, determining a pair of UTS ports of a selected one of the plurality of SRAM UTSs for independent connection to a pair of on-chip test pads, routing the pair of UTS ports of the selected one of the plurality of SRAM UTSs to the pair of on-chip test pads and applying a test signal to the pair of on-chip test pads.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which.

DETAILED DESCRIPTION

Traditional characterization of SRAM cells uses various conventional test structures (CTSs) to collect various transistor and cell characteristics of an SRAM bit design in a semiconductor process. Since different characteristics are collected from different bits on silicon, the intra-cell transistor mismatch data are not readily available and the various measured characteristics cannot be directly correlated. For these reasons, the traditional approach to memory cell characterization limits the usefulness of measurements for memory cell development and for integrated circuit process development and monitoring.

There is a requirement for an on-chip parametric (OCP) circuit for monitoring key cell and transistor characteristics of an SRAM cell used in a product chip. A universal test structure (UTS) provides a promising core structure for employing an SRAM OCP circuit, since it is capable of providing many cell and transistor characteristics of a physical SRAM cell. However, a UTS may have as many as twenty test ports that require manipulation during testing, while an OCP circuit typically allows only two test pads. Embodiments of the present disclosure provide router and control circuits that allow each port to be independently connected to an appropriate collection of test signals.

Figure 1:
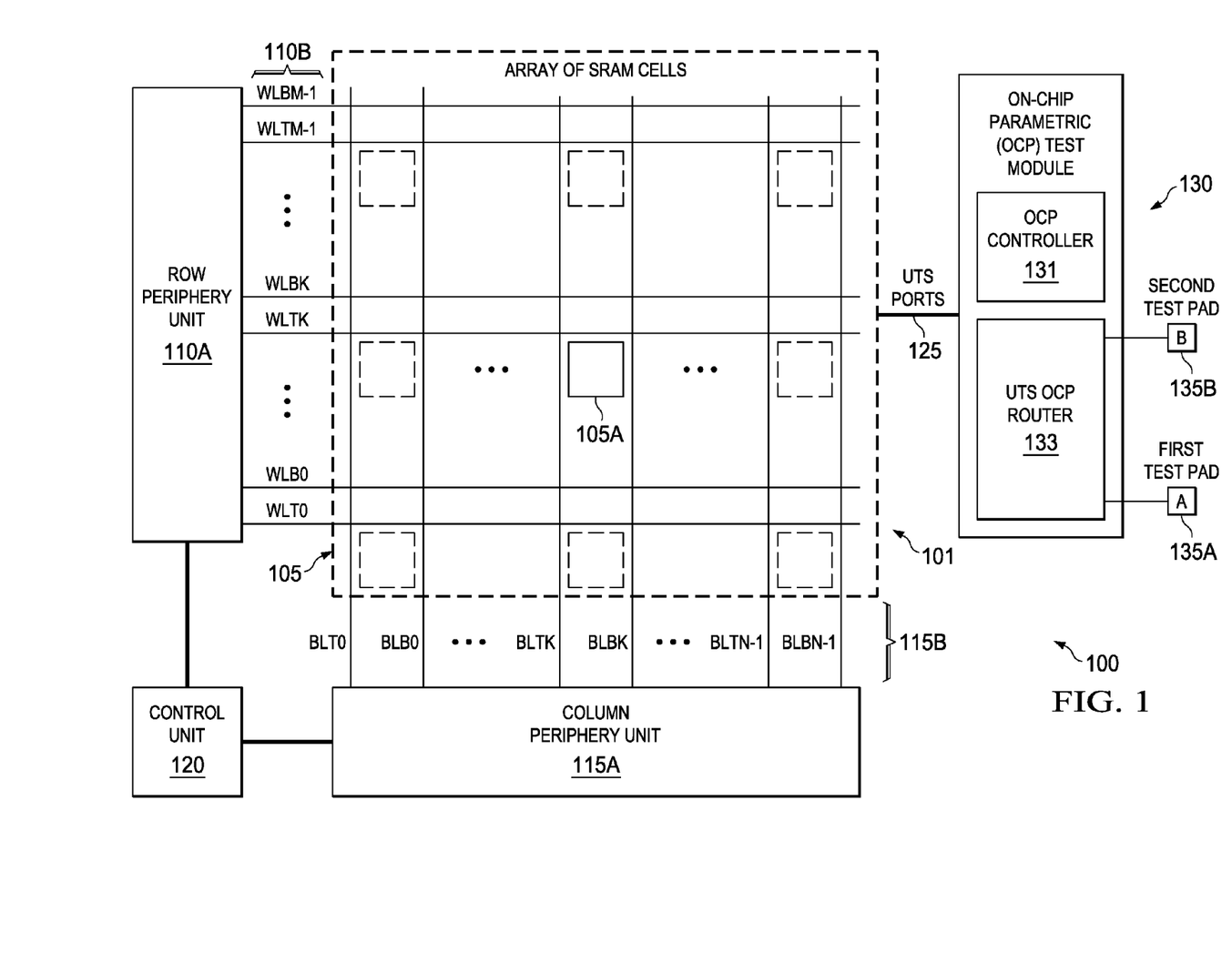
FIG. 1 illustrates a block diagram of an integrated circuit that includes a functional static random access memory (SRAM) and an on-chip parametric (OCP) test module to form an OCP test structure, constructed according to the principles of the present disclosure.

FIG. 1 illustrates a block diagram of an integrated circuit, generally designated 100, that includes a functional static random access memory (SRAM) 101 and an on-chip parametric (OCP) test module 130 to form an OCP test structure, constructed according to the principles of the present disclosure. In general, embodiments of the functional SRAM 101 may be included in the integrated circuit 100 as an embedded memory connected to other portions of the integrated circuit. Alternatively, the functional SRAM 101 may be a discrete memory contained in the integrated circuit.

The functional SRAM 101 includes an array of SRAM cells 105, a row periphery unit 110A, a column periphery unit 115A and a control unit 120. The array of SRAM cells 105 is organized in corresponding rows and columns, as shown. The array of SRAM cells 105 is connected to the row periphery unit 110A. In this example, the array of SRAM cells 105 is connected by M pairs 110B of word lines (i.e., WLT0, WLB0 through WLTM-1, WLBM-1), as may be generally appropriate. Each of the word lines is controlled by a word line driver and each of the M pairs 110B provides access to a row of memory cells corresponding to a portion of the array of SRAM cells 105, as shown.

The array of SRAM cells 105 is also connected to the column periphery unit 115A by N pairs 115B of bit lines (i.e., BLT0, BLB0 through BLTN-1, BLBN-1). Each of these N pairs 115B provides access to a column of SRAM cells in the array 105, as shown. The control unit 120 is connected to the row and column periphery units 110A, 115A and controls their respective operations.

An SRAM cell 105A is typical of the array of SRAM cells 105. In the illustrated example, the SRAM cell 105A contains an SRAM base cell that is organized into a universal test structure (UTS), as will be further discussed with respect to FIG. 2. This SRAM UTS of the SRAM cell 105A is connected through a set of UTS ports 125 to the OCP test module 130. The OCP test module 130 includes an OCP controller 131 and a UTS OCP router 133 that is connected to first and second test pads 135A, 135B, respectively.

The OCP controller 131 is configured to determine first and second UTS ports of the SRAM UTS of the SRAM cell 105A for independent connection to the first and second on-chip test pads 135A, 135B, respectively. The UTS OCP router 133 is configured to connect the first and second UTS ports of the SRAM UTS of the SRAM cell 105A to the first and second on-chip test pads 135A, 135B, respectively.

The term "functional SRAM" as used herein refers to an SRAM whose bits may be accessed (i.e., written to or read from) in a normal manner.

The term "port" as used herein refers to a structure for input to or output from a circuit. In particular, a port is not a part of a memory cell and does not abut any structure in a memory cell. For example, connecting a storage node to a higher interconnect level may provide a port to the storage node. A port is not connected to another port unless explicitly stated.

The term "test pad" refers to a contact area whereby a test signal may be applied or received.

The term "sourcing or sinking voltage supply" refers to a voltage supply whose voltage can be biased without being constrained by another voltage supply.

The term "open", "float" or open circuit as used herein is a low conductivity connection to a port or an electrical circuit.

Figure 2:
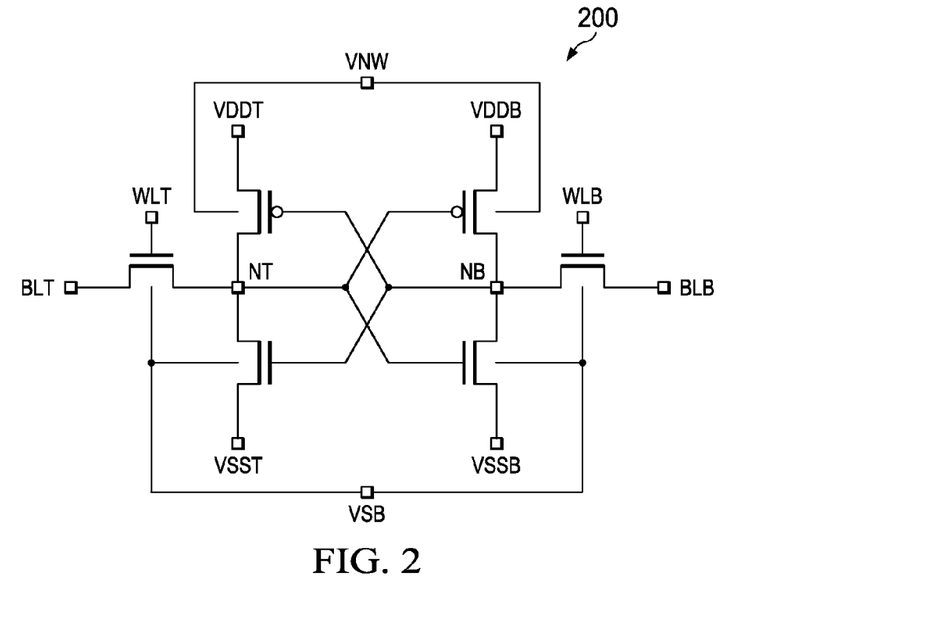
FIG. 2 illustrates a schematic of an example of an SRAM universal test structure (UTS) as may be employed with embodiments of the present disclosure.

FIG. 2 illustrates a schematic of an example of an SRAM universal test structure (UTS), generally designated 200, as may be employed with embodiments of the present disclosure. The SRAM UTS 200 includes a base cell of a six transistor (6T) SRAM cell.

The term "memory base cell" of a memory cell is a cell which contains all the circuit elements (not including interconnect) of the memory cell, where the circuit elements in the memory base cell are sized, positioned, and engineered substantially the same as the corresponding ones in the memory cell, and hence have substantially the same characteristics as the corresponding ones in the memory cell. In a process where the circuit elements are formed by the lower levels, a memory base cell constitutes the lower levels of the associated memory cell. A memory base cell may include additional levels beyond those required for formation of the circuit elements.

Generally, for MOS technology, a base cell will have substantially the same structure as the corresponding memory cell up at least through a GATE layer. A memory base cell with a top layer of GATE has substantially the same structure as the corresponding memory cell up through GATE and has no layers above GATE. A memory base cell with a top layer of CONTACT has no layers above CONTACT. Similarly, a memory base cell with a top layer of METAL1 has no layers above METAL1.

The SRAM base cell in the SRAM UTS 200 provides left/right storage nodes for storing a bit state, wherein the left/right storage nodes are connected to NT/NB ports (T stands for True and B stands for Bar or complement).

Left/right load transistors are connected between the NT/NB ports and sourcing supply voltage ports VDDT/ VDDB. Correspondingly, left/right driver transistors are connected between the NT/NB ports and sinking supply voltage ports VSST/VSSB. Left/right pass gate transistors are connected between the NT/NB ports and BLT/BLB bit line ports wherein the left/right pass gate transistors are controlled by left/right word line ports WLT/WLB. A back-gate sourcing supply voltage port VNW corresponds to the left/right load transistors. Additionally, a back-gate sinking supply voltage port VSB corresponds to the left/right driver transistors and the left/right pass gate transistors. Of course, other SRAM UTSs employing different grouping of transistors or different transistor polarities may be employed.

Figure 3:
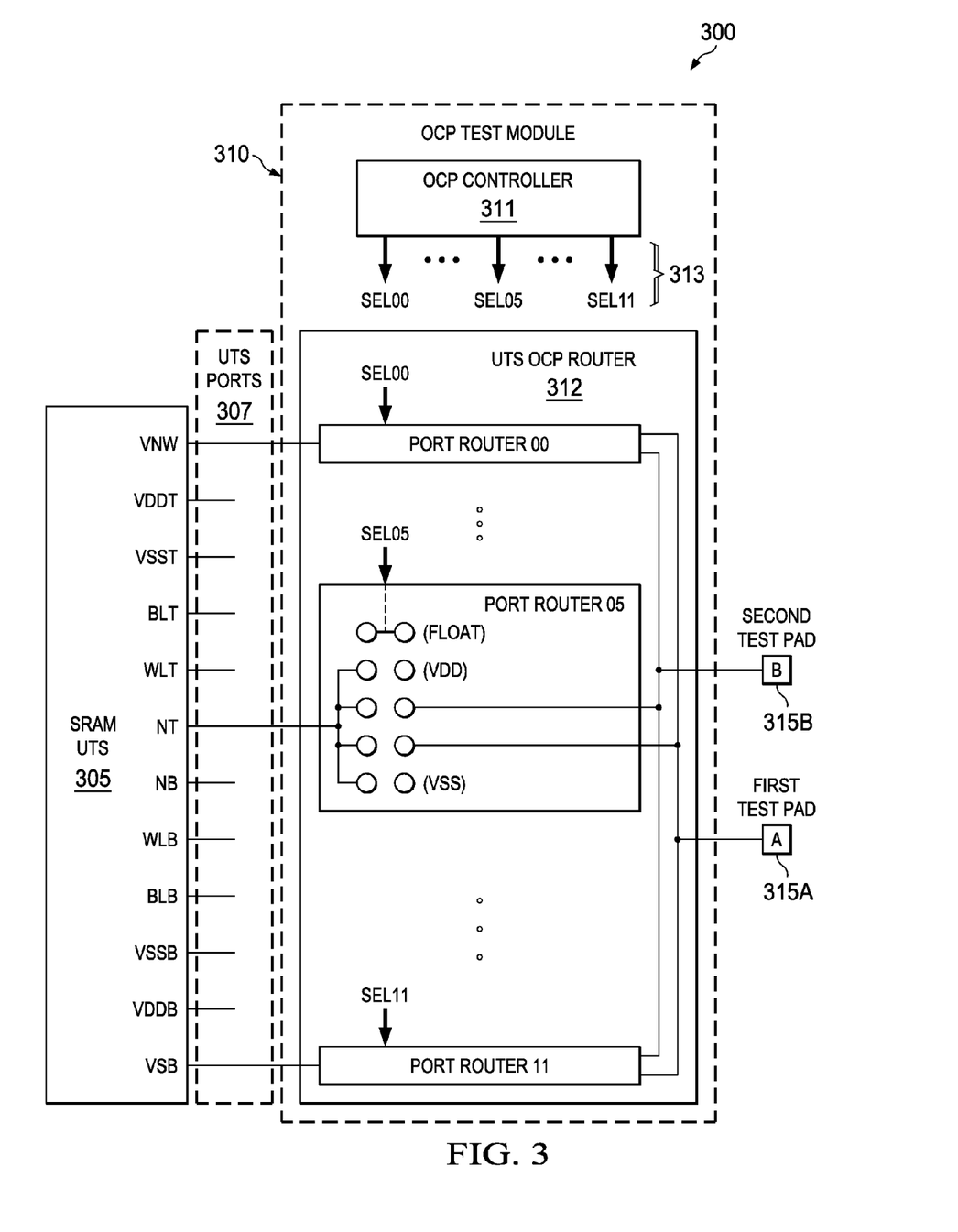
FIG. 3 illustrates a diagram of an example of an integrated circuit OCP test structure constructed according to the principles of the present disclosure.

FIG. 3 illustrates a diagram of an example of an integrated circuit OCP test structure, generally designated 300, constructed according to the principles of the present disclosure. The integrated circuit OCP test structure 300 includes an SRAM UTS 305 that is connected to an OCP test module 310. The OCP test module 310 includes an OCP controller 311 and a UTS OCP router 312. The UTS OCP router 312 is dedicated to the SRAM UTS 305 thereby forming a UTS dedicated OCP test cell. The SRAM UTS 305 provides UTS ports 307 to the UTS OCP router 312, and the OCP controller 311 provides router control signals 313 to the UTS OCP router 312. Router outputs of the UTS OCP router 312 are connected to first and second test pads 315A, 315B.

In the illustrated embodiment, twelve UTS ports 307 are provided for testing the SRAM UTS 305, as discussed with respect to FIG. 2. Each of these twelve UTS ports 307 is connected to one of twelve port routers 00-11 in the UTS OCP router 312, wherein a port router 05 is shown as typical. The router control signals 313, as provided by the OCP controller 311, respectively control each of the twelve port routers 00-11 to provide one of five possible test connections to the twelve UTS ports 307. Only two of the twelve UTS ports 307 may be routed to the first and second test pads 315A, 315B at any one time. The remaining ten UTS ports 307 may be routed to a sinking supply voltage ($V_{SS}$), a sourcing supply voltage ($V_{DD}$) or allowed to float (i.e., allowed to remain an open circuit).

Figure 4A:
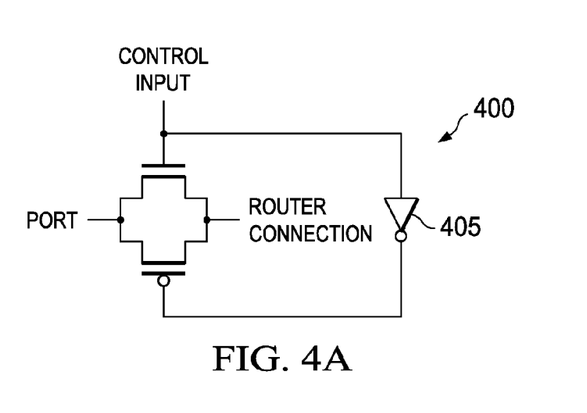
FIGS. 4A and 4B illustrate examples of CMOS multiplexing switches as may be employed in port routers of the UTS OCP router shown in FIG. 3.
Figure 4B:
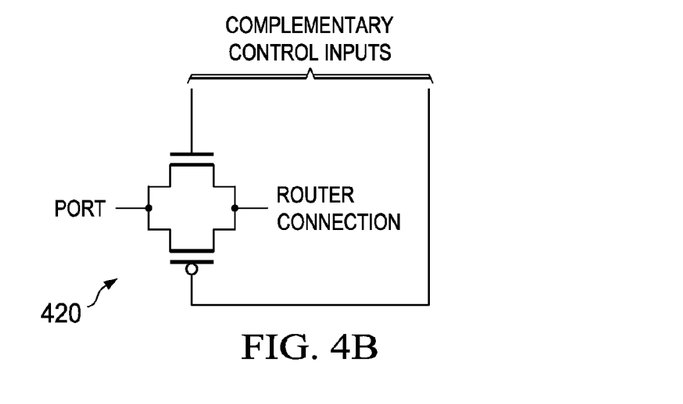

Whereas switching within the twelve port routers 00-11 of FIG. 3 is shown symbolically for clarity, FIGS. 4A and 4B illustrate examples of CMOS multiplexing switches, generally designated 400, 420, as may be employed in port routers of the UTS OCP router 312. Each of the CMOS multiplexing switches 400, 420 includes PMOS and NMOS transistors connected in parallel at sources and drains (i.e., an all P-channel pass-transistor path and an all N-channel pass-transistor path connected in parallel) to provide a bipolar path between a port and a port router connection, as discussed with respect to FIG. 3 above. The CMOS multiplexing switch 400 includes an inverter 405 to provide complementary control signals from a single control input. The CMOS multiplexing switch 420 provides complementary control signals directly.

Figure 5A:
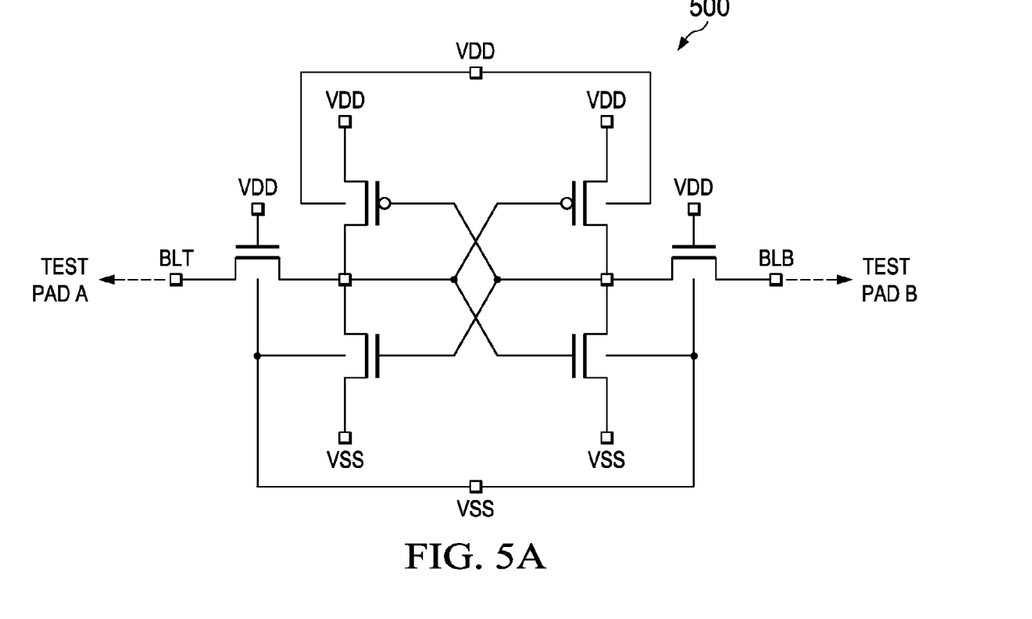
FIGS. 5A, 5B and 5C illustrate examples of SRAM UTS test conditions as may be employed by an OCP test structure corresponding to the principles of the present disclosure.
Figure 5B:
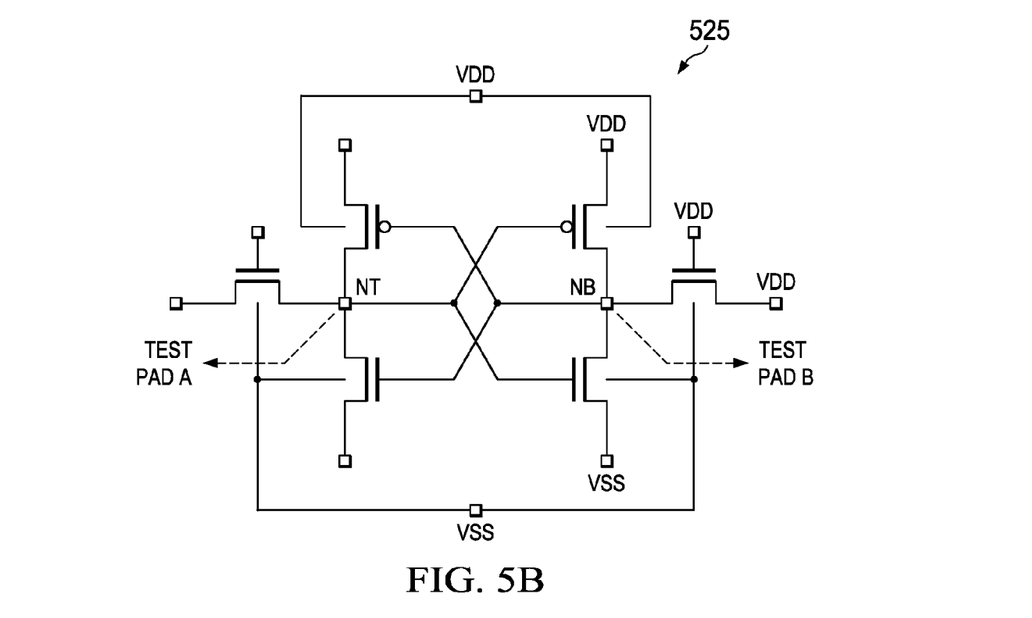
Figure 5C:
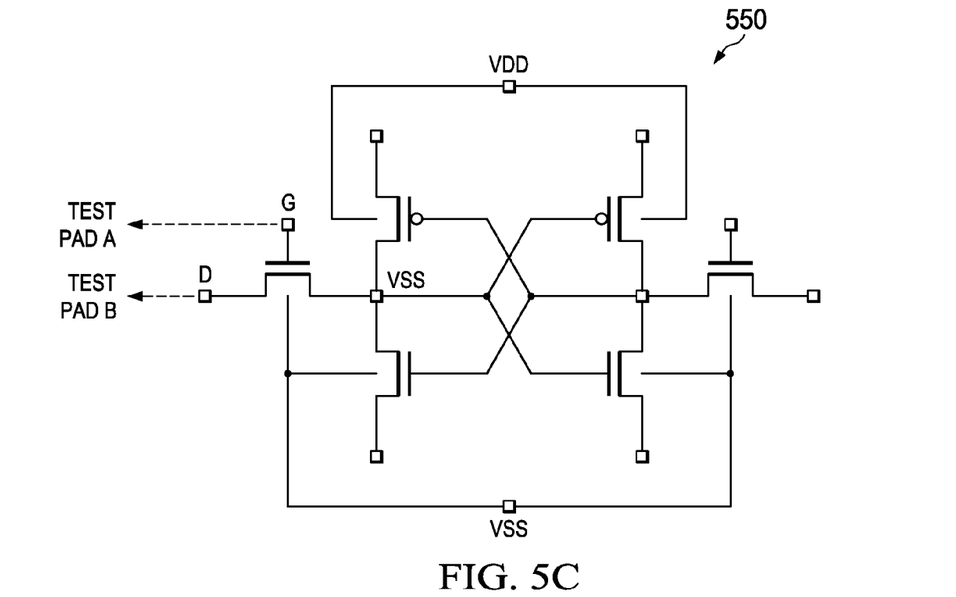

FIGS. 5A, 5B and 5C illustrate examples of SRAM UTS test conditions as may be employed by an OCP test structure, generally designated 500, 525, 550, corresponding to the principles of the present disclosure. FIG. 5A illustrates biasing the SRAM UTS 500 as a full cell and routing the BLT/BLB bit line ports to the first test pad A and the second test pad B, respectively. This testing structure provides determination of quantities such as Vtrip, Iread, Vmin_write, Vmin_disturb and Vmin_data_retention.

FIG. 5B illustrates biasing the SRAM UTS 525 as a half cell at a time (right half cell in this case) and routing NT and NB storage node ports to the first test pad A and the second test pad B, respectively. This test structure provides determination of quantities such as active and standby static noise margins (SNMs).

FIG. 5c illustrates biasing the SRAM UTS 550 as a single transistor at a time (left pass gate transistor in this case) and routing the gate (G) and drain (D) ports to the first test pad A and the second test pad B, respectively. This testing structure provides determination of quantities such as transistor Idsat, Vtsat, Vtlin, Id-Vd and Id-Vg, for example. Of course, these specific examples are intended to illustrate the broad testing capability of an OCP test structure that is based on the principles of the present disclosure.

Figure 6:
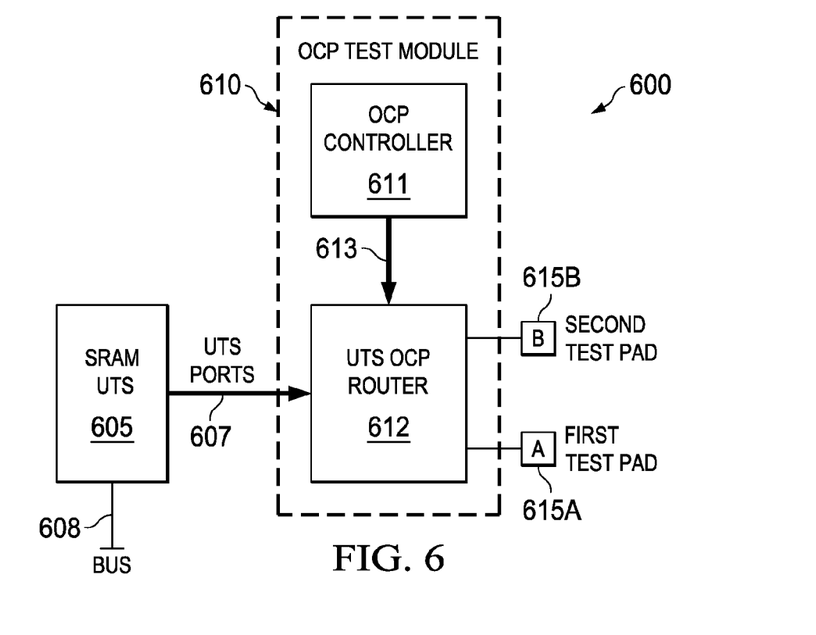
FIG. 6 illustrates another example of an embodiment of an integrated circuit OCP test structure constructed according to the principles of the present disclosure.

FIG. 6 illustrates another example of an embodiment of an integrated circuit OCP test structure, generally designated 600, constructed according to the principles of the present disclosure. The integrated circuit OCP test structure 600 includes an SRAM UTS 605 that is connected to an OCP test module 610. The OCP test module 610 includes an OCP controller 611 and a UTS OCP router 612. The UTS OCP router 612 is dedicated to the SRAM UTS 605 thereby forming a UTS dedicated OCP test cell, as before.

In one embodiment, the SRAM UTS 605 provides a subset of possible UTS ports 607 to the UTS OCP router 612. In another embodiment, a permanently connected remainder of possible UTS ports 608 no longer serve as ports for testing. The OCP controller 611 provides router control signals 613 to the UTS OCP router 612. Router outputs of the UTS OCP router 612 are connected to first and second test pads 615A, 615B. Operation of the OCP test structure 600 corresponds to the OCP test structure 300 for the subset of possible UTS ports 607.

Figure 7:
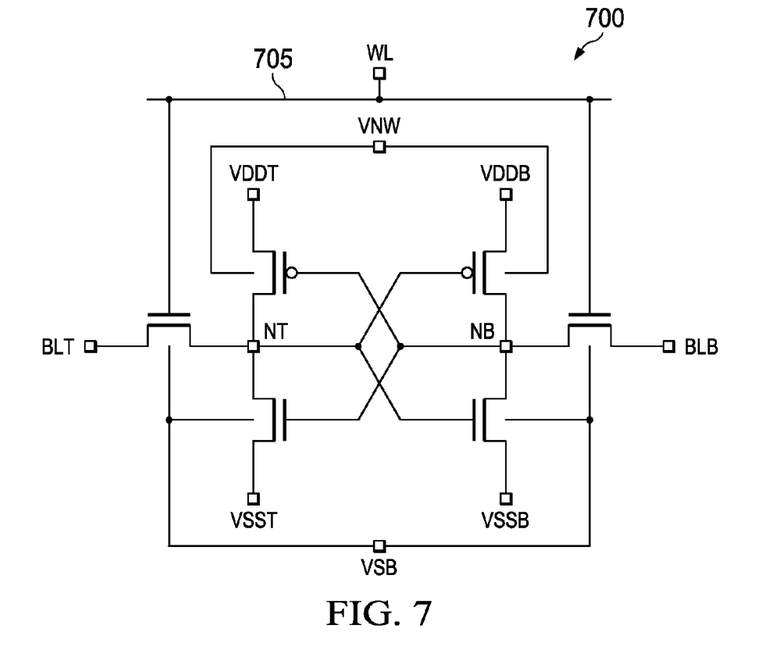
FIG. 7 illustrates a salient example of an SRAM UTS having a subset of possible UTS ports as may be employed with an OCP test structure constructed according to the principles of the present disclosure.

FIG. 7 illustrates a salient example of an SRAM UTS, generally designated 700, having a subset of possible UTS ports as may be employed with an OCP test structure constructed according to the principles of the present disclosure. The SRAM UTS 700 provides a single word line port WL corresponding to a single word line 705 as a subset of more general left/right word line ports WLT/WLB of FIG. 2. Since the SRAM UTS 700 effectively provides a combination of UTS ports, no permanently connected remainder of possible UTS ports exists in this example.

Figure 8A:
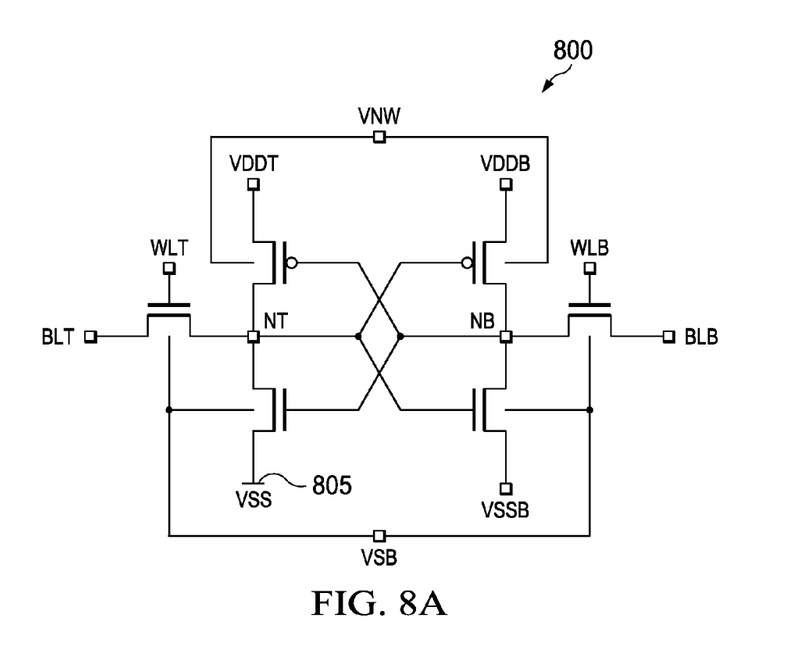
FIGS. 8A, 8B and 8C illustrate examples of SRAM UTSs having both a subset and a permanently connected remainder of possible UTS ports as may be employed with an OCP test structure constructed according to the principles of the present disclosure.
Figure 8B:
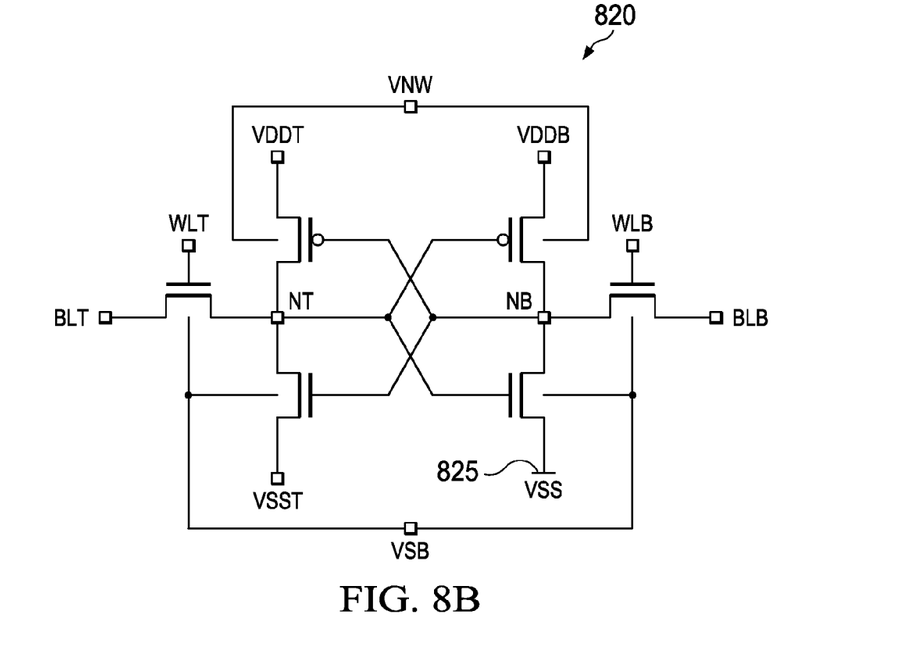
Figure 8C:
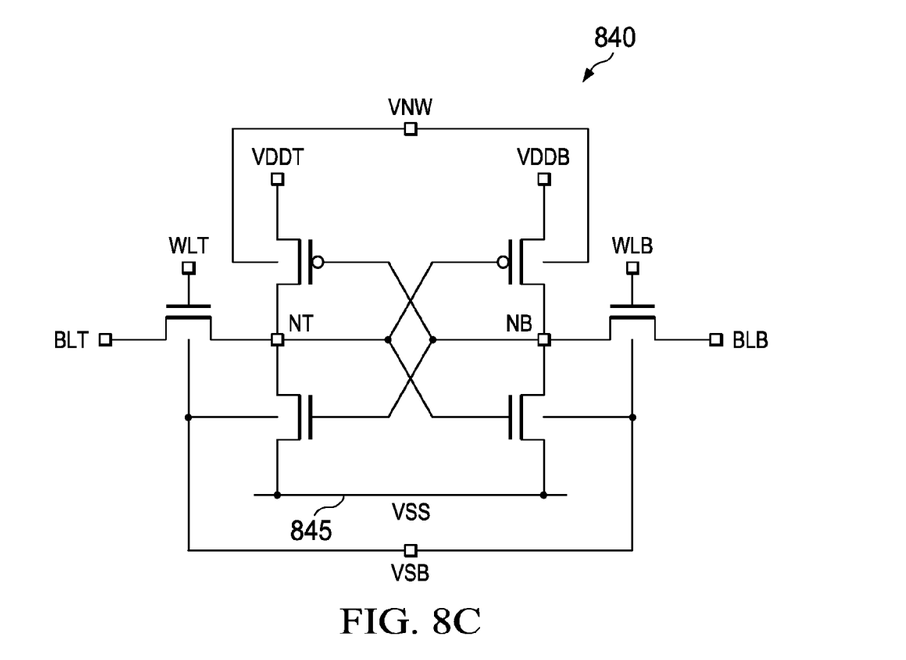

FIGS. 8A, 8B and 8C illustrate examples of SRAM UTSs, generally designated 800, 820 and 840, having both a subset and a permanently connected remainder of possible UTS ports as may be employed with an OCP test structure constructed according to the principles of the present disclosure. The SRAM UTS 800 replaces a sinking supply voltage port VSST with a permanent connection 805 to a sinking supply voltage VSS. The SRAM UTS 820 replaces a sinking supply voltage port VSSB with a permanent connection 825 to a sinking supply voltage VSS. Additionally, the SRAM UTS 840 replaces both sinking supply voltage ports VSST, VSSB with a permanent connection 845 to a sinking supply voltage VSS. Each of these permanent connections provides a subset of possible UTS ports that are available for testing.

FIGS. 9A, 9B, 9C and 9D illustrate additional examples of SRAM UTSs, generally designated 900, 920, 940 and 960, having both a subset and a permanently connected remainder of possible UTS ports as may be employed with an OCP test structure constructed according to the principles of the present disclosure. The SRAM UTS 900 replaces a back-gate sourcing supply voltage port VNW with a permanent connection 905 to a sourcing supply voltage VDD.

Figure 9A:
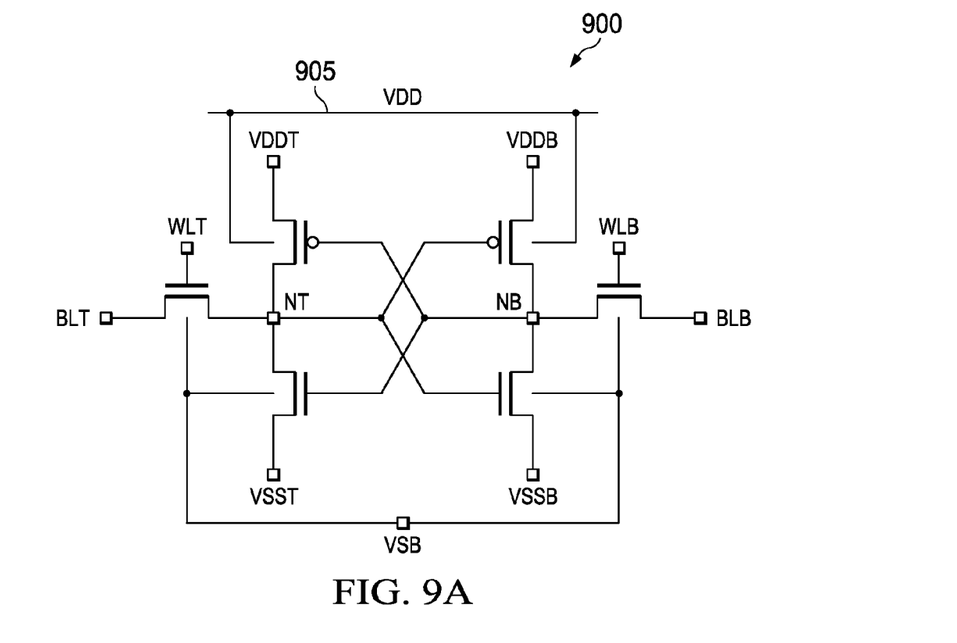
FIGS. 9A, 9B, 9C and 9D illustrate additional examples of SRAM UTSs having both a subset and a permanently connected remainder of possible UTS ports as may be employed with an OCP test structure constructed according to the principles of the present disclosure.
Figure 9B:
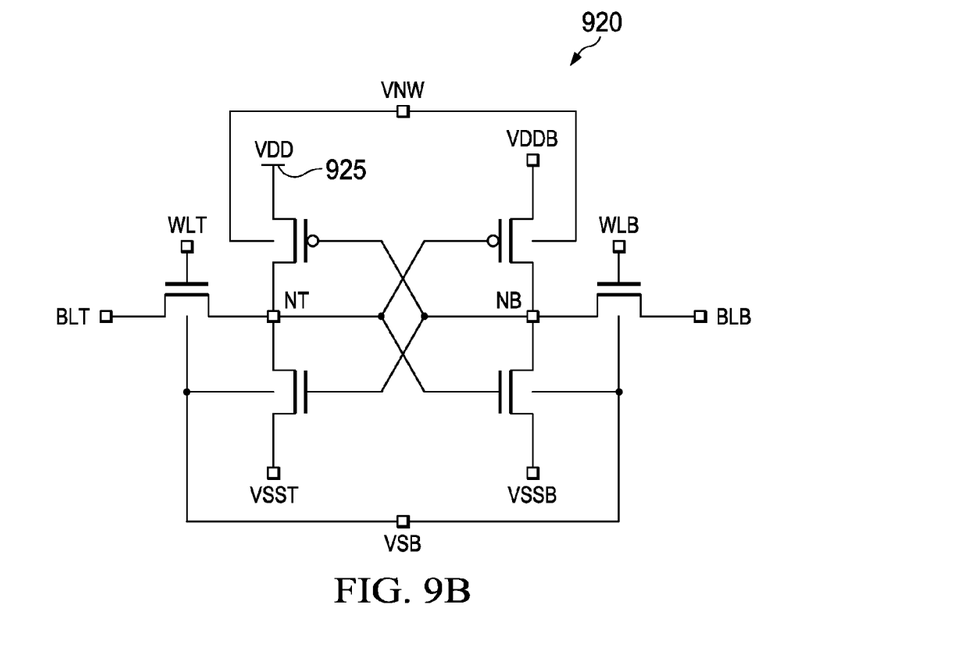
Figure 9C:
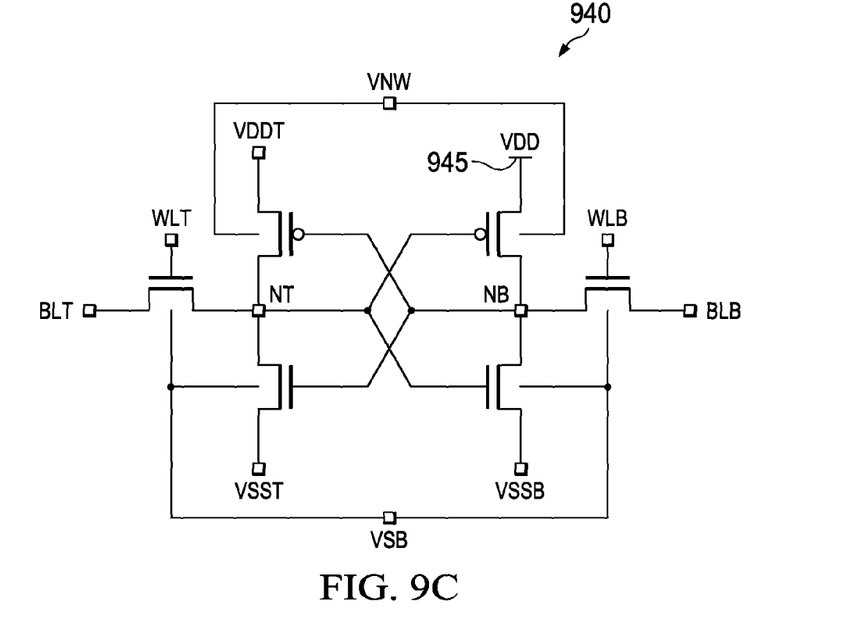
Figure 9D:
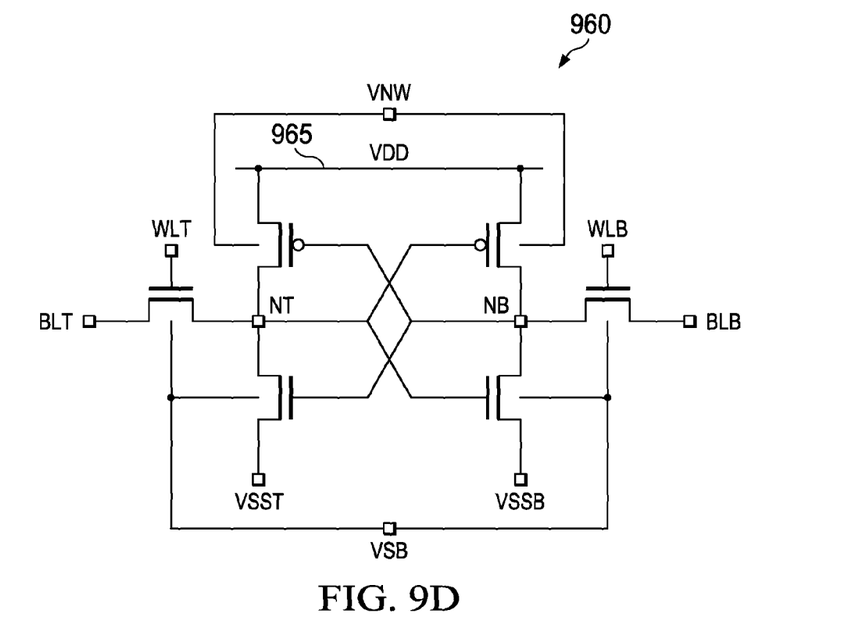

The SRAM UTS 920 replaces a sourcing supply voltage port VDDT with a permanent connection 925 to a sourcing supply voltage VDD. The SRAM UTS 940 replaces a sourcing supply voltage port VDDB with a permanent connection 945 to a sourcing supply voltage VDD. Additionally, The SRAM UTS 960 replaces both sourcing supply voltage ports VDDT, VDDB with a permanent connection 965 to a sourcing supply voltage VDD. Each of these permanent connections reduces a possible number of UTS ports to a subset that is available for testing.

The integrated circuit OCP test structures shown in FIGS. 3 and 6 include a UTS dedicated OCP test cell wherein a UTS OCP router routes test ports from a single SRAM UTS directly to first and second test pads. Although this OCP test structure corresponds to the principles of the present disclosure, it is not as efficient as other embodiments of OCP test structures that require only a single pair of first and second test pads to accommodate a plurality of SRAM UTSs for testing.

Figure 10:
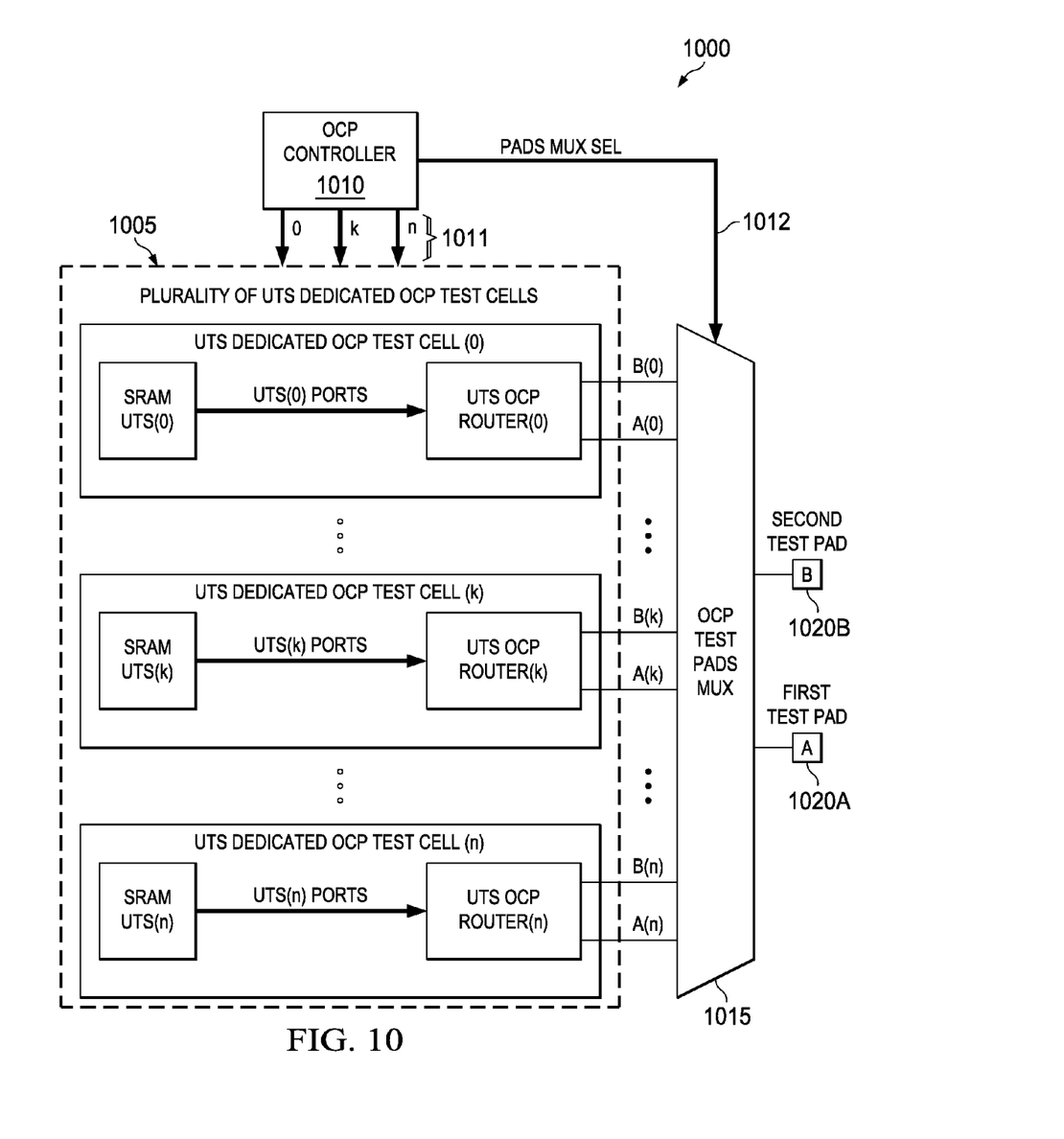
FIG. 10 illustrates an embodiment of an integrated circuit OCP test structure employing a pair of test pads for multiple test cells constructed according to the principles of the present disclosure.

FIG. 10 illustrates an embodiment of an integrated circuit OCP test structure, generally designated 1000, employing a pair of test pads for multiple test cells constructed according to the principles of the present disclosure. The OCP test structure 1000 includes a plurality of UTS dedicated OCP test cells 1005, an OCP controller 1010 and an OCP test pads multiplexer 1015 that is connected to a single pair of first and second test pads 1020A, 1020B, as shown. Each UTS dedicated OCP test cell (0-n) respectively includes an SRAM UTS (0-n) connected to a corresponding UTS OCP router (0-n). Respective first and second router output pairs A(0), B(0)-A(n), B(n) are connected to the OCP test pads multiplexer 1015 for mutually exclusive connection to the single pair of first and second test pads 1020A, 1020B.

Each of the corresponding UTS OCP routers (0-n) is configured to apply test configurations to its SRAM UTS (0-n) (as discussed with respect to FIG. 3, for example) as directed by router control signals 1011 from the OCP controller 1010. A selected router output pair A(0), B(0)-A(n), B(n) is multiplexed through the OCP test pads multiplexer 1015 to the single pair of first and second test pads 1020A, 1020B as controlled by an OCP test pads multiplexer control signals 1012.

Figure 11:
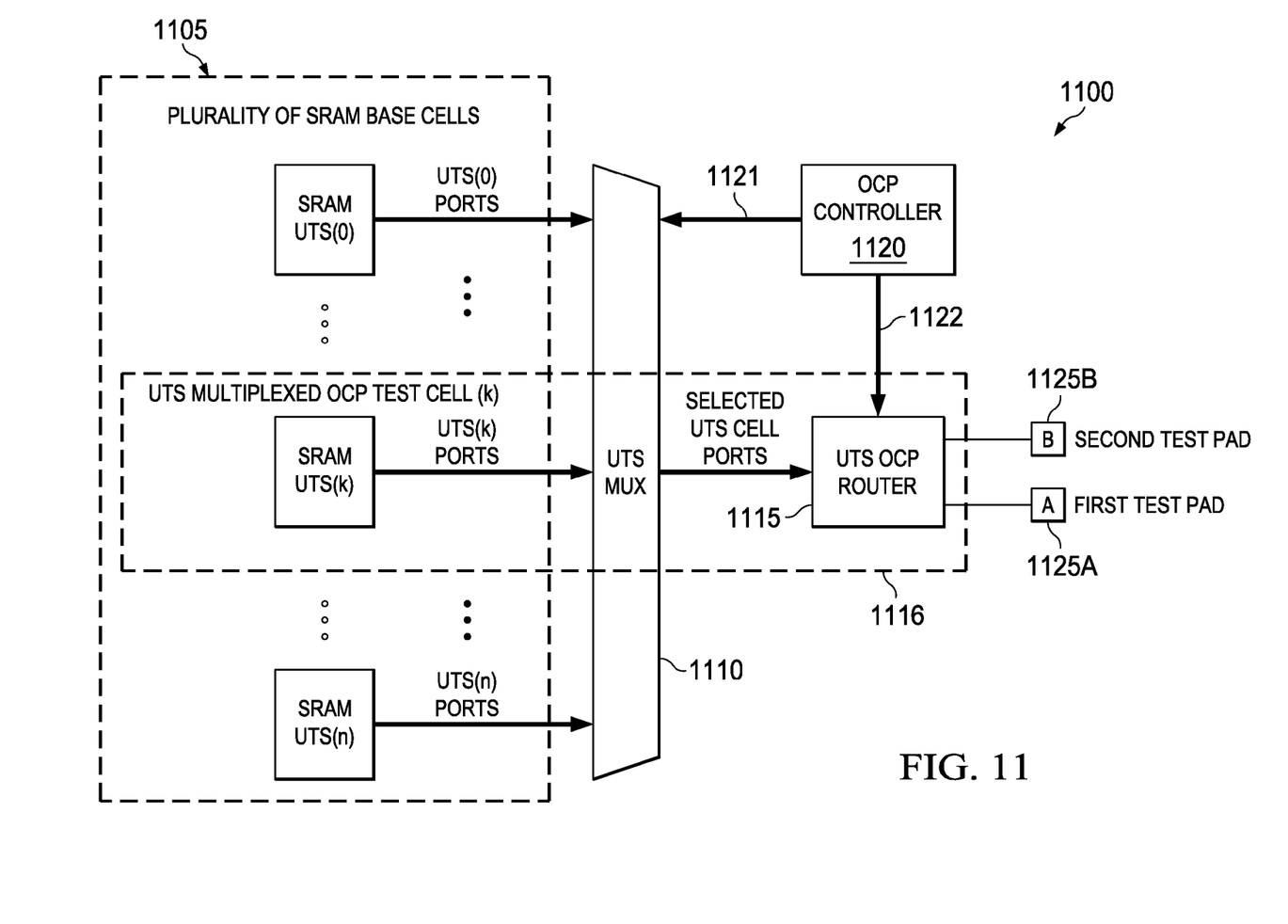
FIG. 11 illustrates another embodiment of an integrated circuit OCP test structure employing UTS multiplexing of multiple SRAM UTSs for routing to a pair of test pads constructed according to the principles of the present disclosure.

Although the OCP test structure 1000 employs a single pair of test pads for testing a plurality of SRAM UTSs, a corresponding plurality of UTS OCP routers are required. FIG. 11 illustrates another embodiment of an integrated circuit OCP test structure, generally designated 1100, employing UTS multiplexing of multiple SRAM UTSs for routing to a pair of test pads constructed according to the principles of the present disclosure. The OCP test structure 1100 includes a plurality of SRAM UTSs 1105, a UTS multiplexer 1110, a single UTS OCP router 1115 that is output connected to first and second test pads 1125A, 1125B and an OCP controller 1120.

In this embodiment, the UTS multiplexer 1110 may alternatively select all UTS ports (e.g., UTS(k) ports) from one of the plurality of SRAM UTSs 1105 for connection to the UTS OCP router 1115 thereby forming a UTS multiplexed OCP test cell 1116. UTS multiplexer control signals 1121 from the OCP controller 1120 provide this selection. Correspondingly, router control signals 1122 from the OCP controller 1120 set up test configurations to the selected SRAM UTS(k) and provide routing control for port selections to the first and second test pads 1125A, 1125B.

Figure 12:
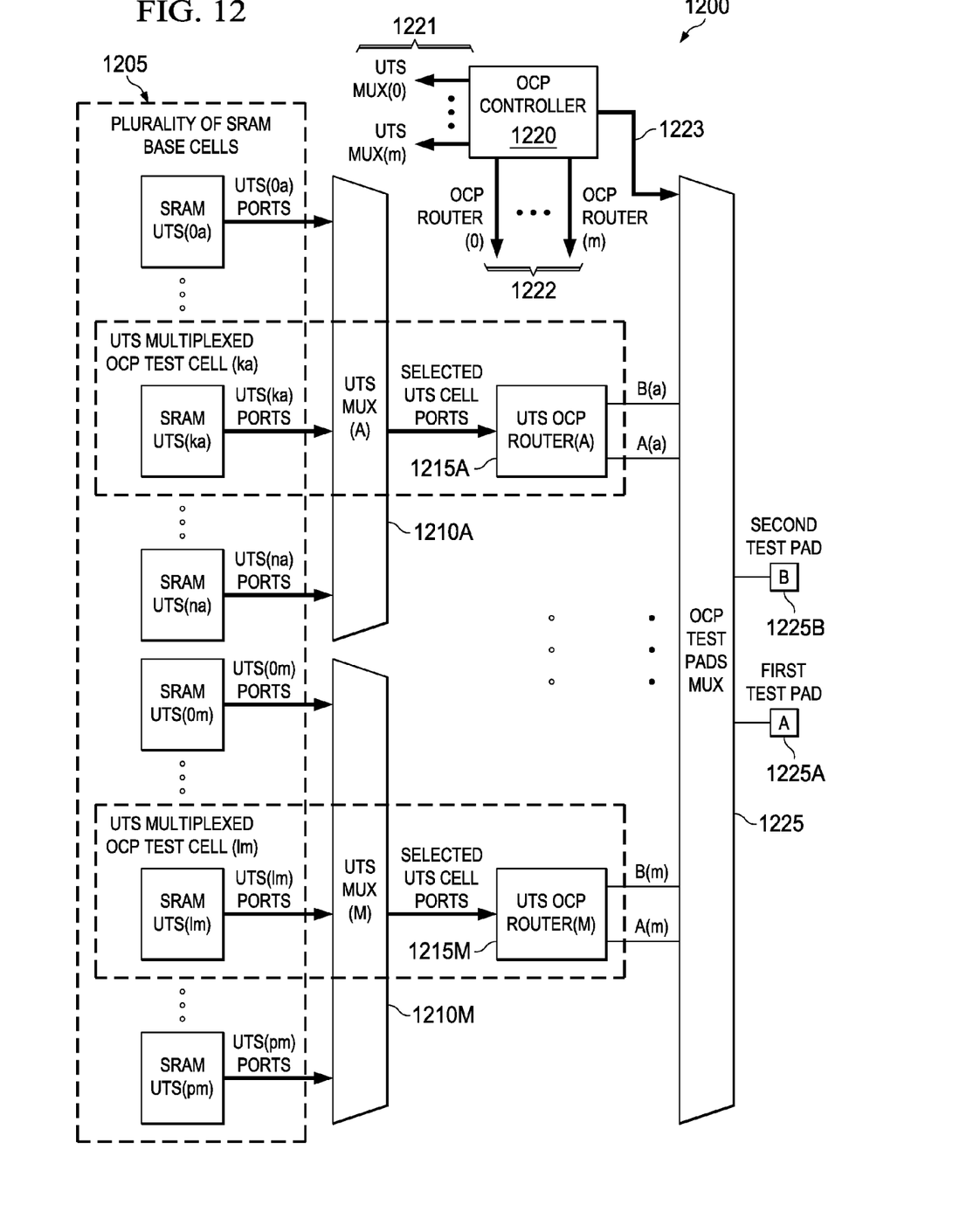
FIG. 12 illustrates yet another embodiment of an integrated circuit OCP test structure employing a plurality of UTS multiplexed OCP test cells and OCP test pads multiplexing for a pair of test pads constructed according to the principles of the present disclosure.

FIG. 12 illustrates yet another embodiment of an integrated circuit OCP test structure, generally designated 1200, employing a plurality of UTS multiplexed OCP test cells and OCP test pads multiplexing for a pair of test pads constructed according to the principles of the present disclosure. The OCP test structure 1200 includes a plurality of OCP test structures, as discussed with respect to FIG. 11, to provide corresponding pluralities of UTS multiplexed OCP test cells for testing.

Each of a plurality of UTS multiplexers 1210A-1210M provides a selected set of UTS cell ports from its corresponding SRAM UTSs (0a-na)-(0m-pm) (e.g., UTS ports (0a-na)) for routing by corresponding UTS OCP routers 1215A-1215M (e.g., UTS OCP router 1215A) as determined by an OCP controller 1220 through its UTS multiplexer control signals 1221. The corresponding UTS OCP routers 1215A-1215M provide testing configurations for the selected sets of UTS cell ports along with a pair of router output connections (A(a),B(a))-(Am),(Bm)) (e.g., router output connections A(a),B(a)) as determined by the OCP controller 1220 through its OCP router control signals 1222. A pair is selected from the router output connections (A(a),B(a))-(Am),B9m)) (e.g., router output connections A(a),B(a)) as determined by the OCP controller 1220 by its OCP test pads multiplexer control signals 1223 for connection through a OCP test pads multiplexer 1225 to first and second test pads 1225A, 1225B.

Figure 13:
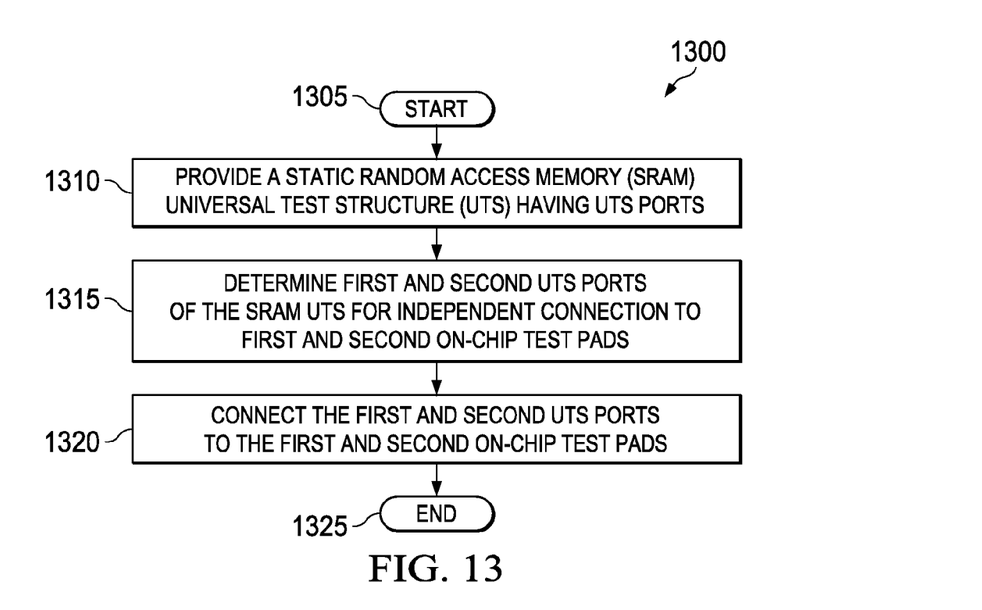
FIG. 13 illustrates a flow diagram of an embodiment of a method of operating an integrated circuit on-chip parametric (OCP) test structure carried out according to the principles of the present disclosure.

FIG. 13 illustrates a flow diagram of an embodiment of a method of operating an integrated circuit on-chip parametric (OCP) test structure, generally designated 1300, carried out according to the principles of the present disclosure. The method 1300 starts in a step 1305, and a static random access memory (SRAM) universal test structure (UTS) having UTS ports is provided in a step 1310. Then, in a step 1315, first and second UTS ports of the SRAM UTS are determined for independent connection to first and second on-chip test pads. The first and second UTS ports of the SRAM UTS are connected to the first and second on-chip test pads in a step 1320. In one embodiment, a portion of remaining UTS ports of the SRAM UTS electrically floats or is routed for connection to one of a sourcing supply voltage and a sinking supply voltage.

In another embodiment, first and second UTS ports of the SRAM UTS correspond to first and second bit lines whereby an SRAM UTS characteristic is measured based on a full cell test. In yet another embodiment, the first and second UTS ports of the SRAM UTS correspond to first and second storage nodes whereby an SRAM UTS characteristic is measured based on a half cell test. In still another embodiment, the first and second UTS ports of the SRAM UTS correspond to a gate terminal and a source or drain terminal of a transistor in the SRAM UTS whereby a transistor characteristic is measured based on a transistor test. The method 1300 ends in a step 1325.

Figure 14:
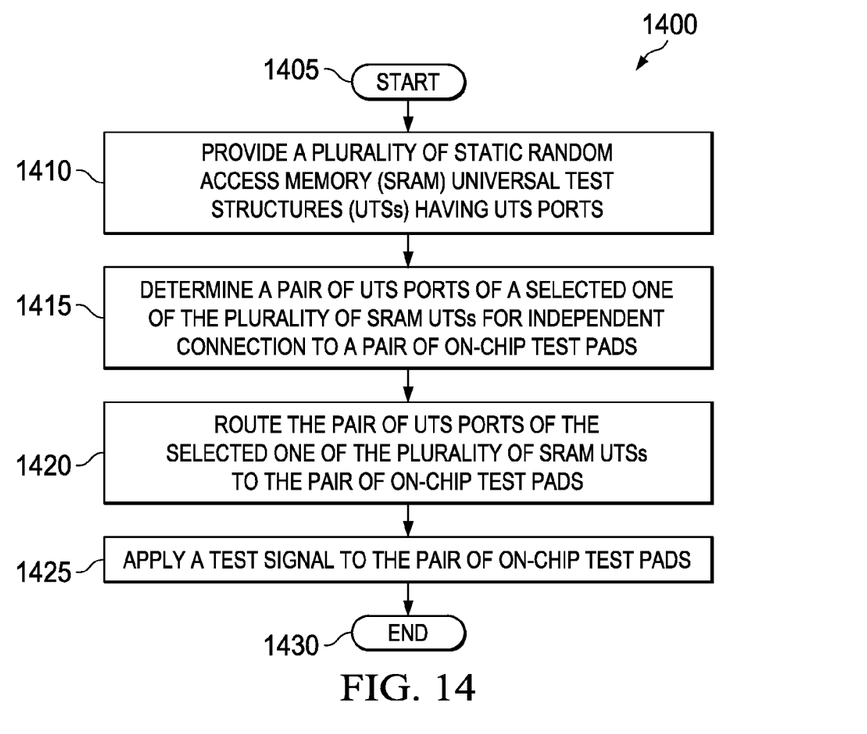
FIG. 14 illustrates a flow diagram of an embodiment of a method of on-chip parametric (OCP) testing of an integrated circuit carried out according to principles of the present disclosure.

FIG. 14 illustrates a flow diagram of an embodiment of a method of on-chip parametric (OCP) testing of an integrated circuit, generally designated 1400, carried out according to principles of the present disclosure. The method 1400 starts in a step 1405, and a plurality of static random access memory (SRAM) universal test structures (UTSs) having UTS ports is provided in a step 1410. Then, in a step 1415, a pair of UTS ports of a selected one of the plurality of SRAM UTSs is determined for independent connection to a pair of on-chip test pads.

The pair of UTS ports of the selected one of the plurality of SRAM UTSs is routed to the pair of on-chip test pads, in a step 1420. In one embodiment, a portion of remaining UTS ports of the selected one of the plurality of SRAM UTSs is routed for connection to one of a sourcing supply voltage and a sinking supply voltage or is allowed to electrically float. In another embodiment, routing the pair of UTS ports of the selected one of the plurality of SRAM UTSs to the pair of on-chip test pads employs OCP test pads multiplexing.

In yet another embodiment, routing the pair of UTS ports of the selected one of the plurality of SRAM UTSs to the pair of on-chip test pads employs UTS multiplexing. In still another embodiment, routing the pair of UTS ports of the selected one of the plurality of SRAM UTSs to the pair of on-chip test pads employs UTS multiplexing and OCP test pads multiplexing. A test signal is applied to the pair of on-chip test pads, in a step 1425. The method 1400 ends in a step 1430.

While the methods disclosed herein have been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which this application relates will appreciate that other and further additions, deletions, substitutions and modifications may be made to the described embodiments.

What is claimed is:

1. An integrated circuit, comprising:
   a static random access memory (SRAM) containing a plurality of SRAM universal test structures (UTSs), each having more than two UTS ports;
   first and second on-chip test pads;
   multiplexer circuitry, coupled between the plurality of SRAM UTSs and the first and second on-chip test pads;
   UTS on-chip parametric (OCP) router circuitry, coupled in series with the multiplexer circuitry between the plurality of SRAM UTSs and the first and second on-chip test pads, the UTS OCP router circuitry for selectively coupling UTS ports to one of the first and second on-chip test pads, to a sourcing supply voltage, to a sinking supply voltage, or to electrically float; and
   an on-chip parametric (OCP) controller coupled to control the multiplexer circuitry to select one of the SRAM UTSs for coupling to the first and second of on-chip test pads, and coupled to the UTS OCP router circuitry to control the selective coupling of UTS ports to the first and second on-chip test pads, to a sourcing supply voltage, to a sinking supply voltage, or to electrically float.

2. The integrated circuit as recited in claim 1, wherein the UTS OCP router circuitry comprises:
   a plurality of UTS OCP routers, each for coupling the UTS ports of one of a subset of the plurality of SRAM UTSs to first and second router outputs, to a sourcing supply voltage, to a sinking supply voltage, or to electrically float, responsive to the OCP controller;
   and wherein the multiplexer circuitry comprises:
   an OCP test pads multiplexer, coupled between the plurality of UTS OCP routers and the first and second on-chip test pads, for coupling the first and second router outputs of a selected one of the UTS OCP routers to the first and second of on-chip test pads, responsive to the OCP controller.

3. The integrated circuit as recited in claim 2, wherein the multiplexer circuitry further comprises:
   a plurality of UTS multiplexers, each coupled between the UTS ports of a plurality of SRAM UTSs and one of the UTS OCP routers, and each for selecting one of its plurality of SRAM UTSs for coupling to its UTS OCP router, responsive to the OCP controller.

4. The integrated circuit as recited in claim 1, wherein the multiplexing circuitry comprises:
   at least one UTS multiplexer coupled between the UTS ports of a plurality of SRAM UTSs and the UTS OCP router circuitry, for selecting one of the plurality of SRAM UTSs for coupling to the UTS OCP router circuitry, responsive to the OCP controller.

5. A method of on-chip parametric (OCP) testing of an integrated circuit, comprising:
   providing a plurality of static random access memory (SRAM) universal test structures (UTSs) having more than two UTS ports;
   selecting a one of the plurality of SRAM UTSs for the coupling of a pair of its UTS ports to a first and second on-chip test pads;
   routing the UTS ports of an SRAM UTS so that a first UTS port of the selected SRAM UTS is coupled to the first test pad, the second UTS port of the selected SRAM UTS is coupled to the second test pad, and others of the UTS ports of the selected SRAM UTS are coupled to a sourcing supply voltage, to a sinking supply voltage, or to electrically float; and
   sensing a test signal at one or both of the first and second on-chip test pads.

6. The method as recited in claim 5 wherein the routing step comprises:
   routing the first and second UTS ports of each of a subset of the plurality of SRAM UTSs to the first and second router outputs;
   and wherein the selecting step comprises:
   selecting the first and second router outputs of one of the subset of the plurality of SRAM UTSs for coupling to the first and second on-chip test pads.

7. The method as recited in claim 6 wherein the selecting step further comprises:
   selecting the UTS ports of one of a plurality of SRAM UTSs to be routed in the routing step.

8. The method as recited in claim 5 wherein the selecting step comprises:
   selecting the UTS ports of one of a plurality of SRAM UTSs to be routed in the routing step.

* * * * *